US011355404B2

(12) United States Patent
Gao et al.

(10) Patent No.: US 11,355,404 B2
(45) Date of Patent: Jun. 7, 2022

(54) MITIGATING SURFACE DAMAGE OF PROBE PADS IN PREPARATION FOR DIRECT BONDING OF A SUBSTRATE

(71) Applicant: Invensas Bonding Technologies, Inc., San Jose, CA (US)

(72) Inventors: Guilian Gao, San Jose, CA (US); Laura Wills Mirkarimi, Sunol, CA (US); Gaius Gillman Fountain, Jr., Youngsville, NC (US)

(73) Assignee: INVENSAS BONDING TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/845,913

(22) Filed: Apr. 10, 2020

(65) Prior Publication Data

US 2020/0335408 A1 Oct. 22, 2020

Related U.S. Application Data

(60) Provisional application No. 62/837,004, filed on Apr. 22, 2019.

(51) Int. Cl.
*H01L 21/66* (2006.01)
*H01L 21/768* (2006.01)
(Continued)

(52) U.S. Cl.
CPC .......... *H01L 22/34* (2013.01); *H01L 21/7685* (2013.01); *H01L 21/76877* (2013.01);
(Continued)

(58) Field of Classification Search
CPC ................. H01L 22/34; H01L 21/7685; H01L 21/76877; H01L 23/5226; H01L 23/53238; H01L 23/53266; H01L 23/5386
See application file for complete search history.

(56) References Cited

U.S. PATENT DOCUMENTS 5,391,516 A * 2/1995 Wojnarowski .... H01L 21/76877 257/E21.585
5,753,536 A 5/1998 Sugiyama et al.
(Continued)

FOREIGN PATENT DOCUMENTS

JP 2002-353416 A 6/2002
JP 2013-33786 A 2/2013
(Continued)

OTHER PUBLICATIONS

Ker, Ming-Dou et al., "Fully Process-Compatible Layout Design on Bond Pad to Improve Wire Bond Reliability in CMOS ICs," IEEE Transactions on Components and Packaging Technologies, Jun. 2002, vol. 25, No. 2, pp. 309-316.
(Continued)

*Primary Examiner* — Fernando L Toledo
*Assistant Examiner* — Neil R Prasad
(74) *Attorney, Agent, or Firm* — Knobbe, Martens, Olson & Bear LLP

(57) ABSTRACT

Mitigating surface damage of probe pads in preparation for direct bonding of a substrate is provided. Methods and layer structures prepare a semiconductor substrate for direct bonding processes by restoring a flat direct-bonding surface after disruption of probe pad surfaces during test probing. An example method fills a sequence of metals and oxides over the disrupted probe pad surfaces and builds out a dielectric surface and interconnects for hybrid bonding. The interconnects may be connected to the probe pads, and/or to other electrical contacts of the substrate. A layer structure is described for increasing the yield and reliability of the resulting direct bonding process. Another example process builds the probe pads on a next-to-last metallization layer and then applies a direct bonding dielectric layer and damascene process without increasing the count of mask layers.
(Continued)

Another example process and related layer structure recesses the probe pads to a lower metallization layer and allows recess cavities over the probe pads.

22 Claims, 11 Drawing Sheets

(51) Int. Cl.
*H01L 23/532* (2006.01)
*H01L 23/538* (2006.01)
*H01L 23/522* (2006.01)

(52) U.S. Cl.
CPC ...... *H01L 23/5226* (2013.01); *H01L 23/5386* (2013.01); *H01L 23/53238* (2013.01); *H01L 23/53266* (2013.01)

(56) References Cited

U.S. PATENT DOCUMENTS

| | | | | |
|---|---|---|---|---|
| 5,771,555 | A | 6/1998 | Eda et al. | |
| 6,080,640 | A | 6/2000 | Gardner et al. | |
| 6,423,640 | B1 | 7/2002 | Lee et al. | |
| 6,465,392 | B1 | 10/2002 | Suga | |
| 6,887,769 | B2 | 5/2005 | Kellar et al. | |
| 6,908,027 | B2 | 6/2005 | Tolchinsky et al. | |
| 7,045,453 | B2 | 5/2006 | Canaperi et al. | |
| 7,105,980 | B2 | 9/2006 | Abbott et al. | |
| 7,193,423 | B1 | 3/2007 | Dalton et al. | |
| 7,750,488 | B2 | 7/2010 | Patti et al. | |
| 7,803,693 | B2 | 9/2010 | Trezza | |
| 8,183,127 | B2 | 5/2012 | Patti et al. | |
| 8,349,635 | B1 | 1/2013 | Gan et al. | |
| 8,377,798 | B2 | 2/2013 | Peng et al. | |
| 8,441,131 | B2 | 5/2013 | Ryan | |
| 8,476,165 | B2 | 7/2013 | Trickett et al. | |
| 8,482,132 | B2 | 7/2013 | Yang et al. | |
| 8,501,537 | B2 | 8/2013 | Sadaka et al. | |
| 8,524,533 | B2 | 9/2013 | Tong et al. | |
| 8,620,164 | B2 | 12/2013 | Heck et al. | |
| 8,647,987 | B2 | 2/2014 | Yang et al. | |
| 8,697,493 | B2 | 4/2014 | Sadaka | |
| 8,716,105 | B2 | 5/2014 | Sadaka et al. | |
| 8,802,538 | B1 | 8/2014 | Liu | |
| 8,809,123 | B2 | 8/2014 | Liu et al. | |
| 9,093,350 | B2 | 7/2015 | Endo et al. | |
| 9,142,517 | B2 | 9/2015 | Liu | |
| 9,171,756 | B2 | 10/2015 | Enquist et al. | |
| 9,224,704 | B2 | 12/2015 | Landru | |
| 9,230,941 | B2 | 1/2016 | Chen et al. | |
| 9,257,399 | B2 | 2/2016 | Kuang et al. | |
| 9,299,736 | B2 | 3/2016 | Chen et al. | |
| 9,312,229 | B2 | 4/2016 | Chen et al. | |
| 9,337,235 | B2 | 5/2016 | Chen et al. | |
| 9,394,161 | B2 | 7/2016 | Cheng et al. | |
| 9,437,572 | B2 | 9/2016 | Chen et al. | |
| 9,443,796 | B2 | 9/2016 | Chou et al. | |
| 9,461,007 | B2 | 10/2016 | Chun et al. | |
| 9,496,239 | B1 | 11/2016 | Edelstein et al. | |
| 9,536,848 | B2 | 1/2017 | England et al. | |
| 9,559,081 | B1 | 1/2017 | Lai et al. | |
| 9,620,481 | B2 | 4/2017 | Edelstein et al. | |
| 9,656,852 | B2 | 5/2017 | Cheng et al. | |
| 9,723,716 | B2 | 8/2017 | Meinhold | |
| 9,728,521 | B2 | 8/2017 | Tsai et al. | |
| 9,799,587 | B2 | 10/2017 | Fujii et al. | |
| 9,893,004 | B2 | 2/2018 | Yazdani | |
| 9,929,050 | B2 | 3/2018 | Lin | |
| 9,941,241 | B2 | 4/2018 | Edelstein et al. | |
| 9,941,243 | B2 | 4/2018 | Kim et al. | |
| 9,953,941 | B2 | 4/2018 | Enquist | |
| 9,960,142 | B2 | 5/2018 | Chen et al. | |
| 10,026,605 | B2 | 7/2018 | Doub et al. | |
| 10,075,657 | B2 | 9/2018 | Fahim et al. | |
| 10,269,756 | B2 | 4/2019 | Uzoh | |
| 10,276,619 | B2 | 4/2019 | Kao et al. | |
| 2002/0003307 | A1* | 1/2002 | Suga | H01L 25/0657 257/777 |
| 2002/0135055 | A1* | 9/2002 | Cho | H01L 23/5258 257/678 |
| 2004/0084414 | A1 | 5/2004 | Sakai et al. | |
| 2006/0057945 | A1 | 3/2006 | Hsu et al. | |
| 2007/0111386 | A1 | 5/2007 | Kim et al. | |
| 2011/0156032 | A1* | 6/2011 | Zhang | H01L 22/20 257/48 |
| 2013/0072011 | A1* | 3/2013 | Zhang | H01L 22/20 438/612 |
| 2014/0175655 | A1 | 6/2014 | Chen et al. | |
| 2015/0064498 | A1 | 3/2015 | Tong | |
| 2016/0343682 | A1 | 11/2016 | Kawasaki | |
| 2018/0175012 | A1 | 6/2018 | Wu et al. | |
| 2018/0182639 | A1 | 6/2018 | Uzoh et al. | |
| 2018/0182666 | A1 | 6/2018 | Uzoh et al. | |
| 2018/0219038 | A1 | 8/2018 | Gambino et al. | |
| 2018/0323177 | A1 | 11/2018 | Yu et al. | |
| 2018/0323227 | A1 | 11/2018 | Zhang et al. | |
| 2018/0331066 | A1 | 11/2018 | Uzoh et al. | |
| 2019/0115277 | A1 | 4/2019 | Yu et al. | |
| 2019/0131277 | A1 | 5/2019 | Yang et al. | |
| 2019/0385963 | A1* | 12/2019 | Chen | H01L 25/50 |
| 2019/0393194 | A1* | 12/2019 | Chen | H01L 21/7684 |

FOREIGN PATENT DOCUMENTS

| | | |
|---|---|---|
| JP | 2018-160519 A | 10/2018 |
| WO | 2005-043584 A2 | 5/2005 |

OTHER PUBLICATIONS

Moriceau, H. et al., "Overview of Recent Direct Wafer Bonding Advances and Applications", Advances in Natural Sciences-Nanoscience and Nanotechnology, 2010, 12 pages.

Nakanishi, H. et al., "Studies on SiO2—SiO2 Bonding with Hydrofluoric Acid. Room Temperature and Low Stress Bonding Technique for MEMS," Tech. Research Lab., 200, Elsevier Science S.A., 8 pages.

Oberhammer et al., "Sealing of Adhesive Bonded Devices on Wafer Level," in Sensors and Actuators A, vol. 110, No. 1-3, pp. 407-412, Feb. 29, 2004, see pp. 407-412; and figures 1(a)-1(I), 6 pages.

Plobi et al., "Wafer Direct Bonding: Tailoring Adhesion Between Brittle Materials," Materials Science and Engineering Review Journal, 1999, 88 pages.

Suga et al., "Bump-less Interconnect for Next Generation System Packaging," IEEE (2001) and ECTC 2001, 6 pages.

WO2020028080 Search Report and Written Opinion, dated Jul. 2019, 9 pages.

* cited by examiner

MITIGATING SURFACE DAMAGE OF PROBE PADS IN PREPARATION FOR DIRECT BONDING OF A SUBSTRATE

RELATED APPLICATIONS

This patent application claims the benefit of priority to U.S. Provisional Patent Application No. 62/837,004 to Gao et al., filed on Apr. 22, 2019 and incorporated by reference herein, in its entirety.

BACKGROUND

Test probing is routinely carried out on substrates, such as substrates of semiconductor materials, and on dies and reconstituted panels in microelectronics. Test probes make physical contact with probe pads on the given substrate. But the test probes can leave "probe marks" and surface disruption ("protrusions"), which can rise above the level of the dielectric passivation layer usually present around or above the probe pads. While this occurrence may not be a problem for some types of finished substrates, wafers, and dies, the probe pad protrusions can ruin the flatness of the overall top surface of the substrate for purposes of direct bonding processes that would join the substrate efficiently to other surfaces, for example in wafer-to-wafer bonding or die-to-wafer bonding, for example.

Direct bonding processes include techniques that accomplish oxide-oxide direct-bonding between dielectrics, and also include techniques that accomplish hybrid bonding, which can bond metal interconnects together in an annealing step of the same operation that direct-bonds the dielectrics together.

Conventional solutions for probe pad damage include adding sacrificial metallization layers or sacrificial probe pads to wafers, but these solutions are awkward and expensive.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

This disclosure describes methods and layer structures for mitigating surface damage of probe pads in preparation for direct bonding of a substrate, such as a reconstituted panel or the semiconductor substrate of a wafer or die.

One example method prepares a semiconductor wafer for direct bonding processes by restoring a flat surface suitable for direct-bonding after disruption of probe pad surfaces during test probing. The example method fills a sequence of metals and oxides over the disrupted probe pad surfaces and builds out a dielectric surface and interconnects for hybrid bonding. An example layer structure associated with the method is described for increasing the yield and reliability of the resulting direct bonding process. Another example process builds the probe pads on a next-to-last metallization layer and then applies a direct bonding dielectric layer and a patterning or damascene process without increasing the count of metallization mask layers. Another example process and related layer structure recesses the probe pads to a lower metallization layer than the conventional top layer for probe pads, and forms recess cavities over the probe pads, which do not interfere with direct bonding at the topmost surface. In one case, liquid metals can be used in the recess cavities for test probing without disrupting probe pad surfaces.

Example Processes and Layer Structures

Figure 1:
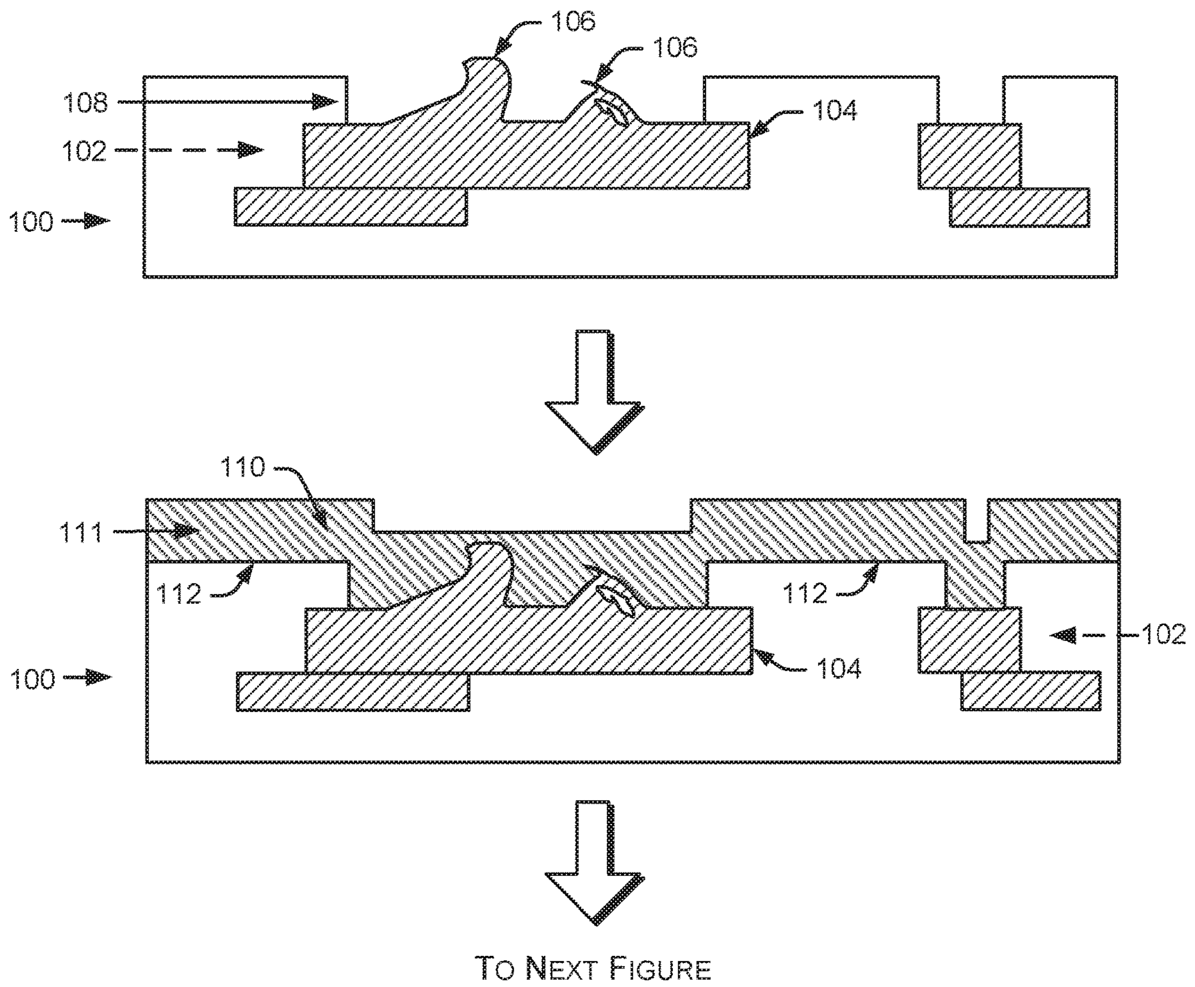
FIG. 1 is a diagram of a first example sequence of fabrication steps and resulting layer structures of an example wafer substrate, for mitigating damage to probe pads in preparation for direct bonding of the wafer substrate.

FIG. 1 shows a section of an example substrate, in this case a semiconductor wafer (or die) 100 to be joined to another wafer, die, or substrate in a direct bonding process. The wafer (or die) 100 is made of semiconductor material, such as silicon, and includes one or more layers of metallization 102 and probe pads 104 for testing the wafer (or die)

100. The probe pads 104 may be aluminum metal (Al), copper (Cu), or other metal. The probe pads 104 may have protrusions 106 from contact with a test probe, which makes temporary contact during testing of the wafer (or die) 100. The protrusions 106 may rise above the top level of a surrounding dielectric, oxide, or nitride layer 108, preventing the top surface of the wafer (or die) 100 from attaining the flatness needed for direct bonding to another wafer or die.

An example method deposits or overfills a layer or region of metal 110, such as copper (Cu), over the probe pads 104 and over at least part of the protrusions 106. The metal deposited may overfill 111 in a layer that covers the field regions 112 of the wafer (or die) 100. In an implementation, an adhesion coating or a seed coating or a barrier coating of, for example, titanium (Ti), or Ta, or TaN, or TiN, or TiW (or a combination of these) may be deposited on at least the protrusions 106 and the probe pads 104 before the step of depositing or overfilling the metal 110 over the probe pads 104. The seed coating or barrier coating of Ti, Ta, TaN, TiN, or TiW, for example, may also cover larger areas of the field regions 112 prior to the step of depositing or overfilling the metal 110 over the probe pads 104 and potentially over these field regions 112 that may also have the barrier coating.

Figure 2:
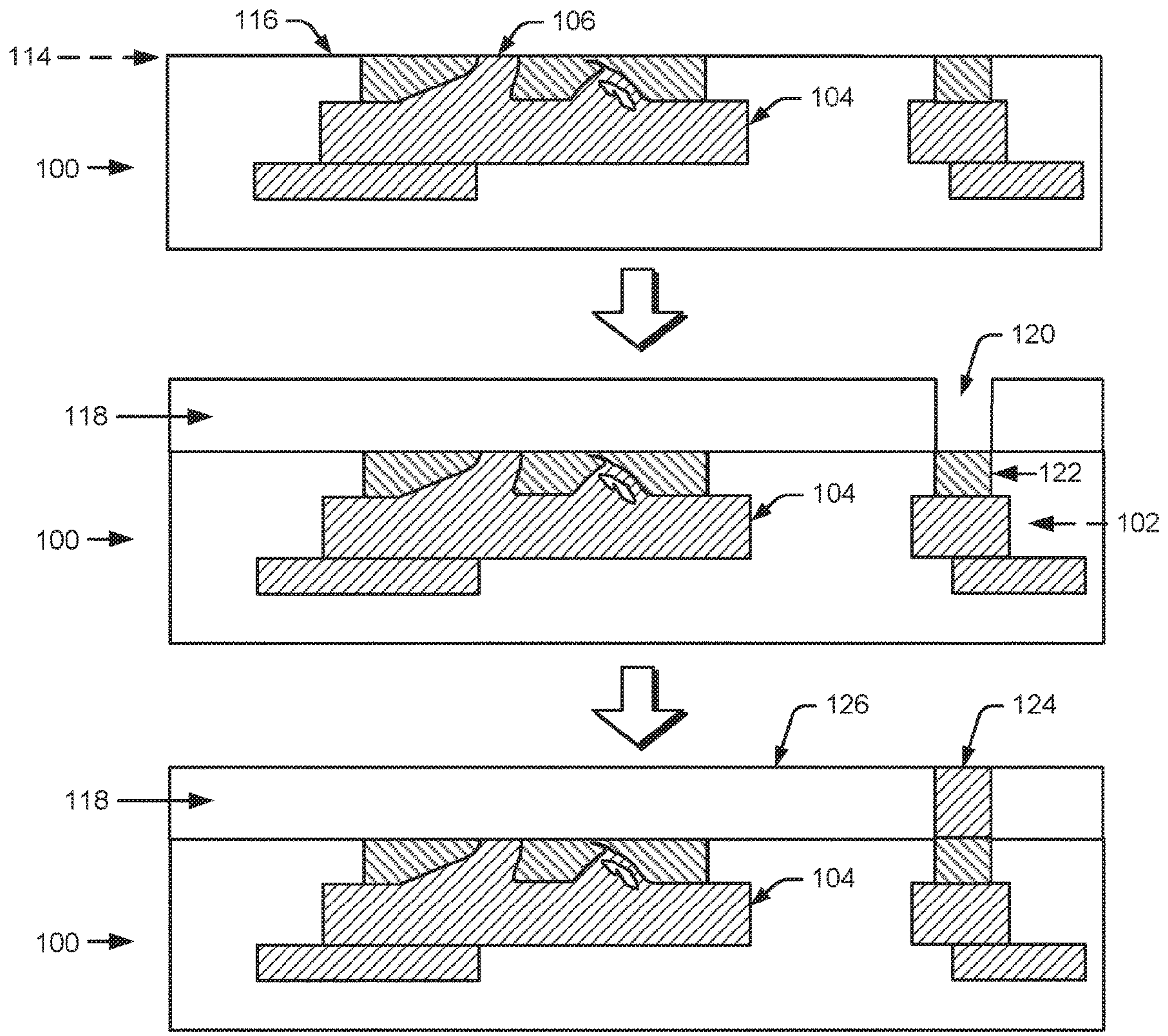
FIG. 2 is a diagram of a continuation of the example sequence of fabrication steps and resulting layer structures of FIG. 1, for mitigating damage to probe pads in preparation for direct bonding of the wafer substrate.

As shown in FIG. 2 (continues FIG. 1), the metal 110 deposited on the probe pads 104 and tops of the protrusions 106 are then planarized 114 by chemical mechanical polishing (CMP) or other polishing or flattening procedure to a flat surface 116 sufficient to meet a general planarization specification. The step of planarizing 114 both the metal 110 over the probe pads 104 and the protrusions 106 to the flat surface may include removing or polishing overfilled metal 111 on the field regions 112 of the wafer (or die) 100 to flatness until the metal 110 is removed from the field regions 112.

A layer of a dielectric material 118 is applied on the flat surface 116 provided by CMP. The layer of dielectric material 118 is a suitable material for direct bonding or hybrid bonding to another wafer, die, or substrate. In an implementation, the dielectric or oxide material 118 is a layer of "low temperature" oxide, applied by plasma enhanced chemical vapor deposition (PE-CVD), for example, such as a low temperature tetraethoxysilane (LT-TEOS), or another thermal oxide or other dielectric material suitable for direct bonding or hybrid bonding.

The example process then creates a pattern 120 in the layer of dielectric 118 using a damascene or other technique to make openings 120 over electrical contacts 122, over through-silicon-vias (TSVs), or over other interconnects that are in contact with an underlying layer of metallization 102.

A metal 124 suitable for direct bonding is then deposited or plated in the openings 120 or in the pattern, to form interconnects. The deposited metal 124 may be prepared in various ways for the direct bonding process to occur at the topmost surface of the applied layers. In an implementation, a barrier layer of Ti, Ta, TaN, TiN, or TiW (or a combination of these) is deposited at least in the openings 120 or in both the openings 120 and the field regions 112 before depositing copper metal 124 or other metal in the openings 120 and on the field regions 122, both of which may have a seed layer or barrier coating applied to their surfaces after the step of patterning the layer of dielectric 118.

The metal 124 and the layer of dielectric 118, and the seed layer or barrier coating, when present, are then planarized with CMP or other technique to a flatness specification suitable for the direct bonding process or hybrid bonding process at the topmost surface 126.

In one example embodiment, the probe pads 104 are at least partially embedded in a layer of silicon nitride ($Si_3N_4$) or other dielectric. The metal 110 to be deposited, plated, or overfilled onto the probe pads 104 may be added up to a vertical height that reaches or fills-in to the top of a passivation layer, such as the silicon nitride or a silicon oxide layer 108, around the probe pads 104.

Figure 3:
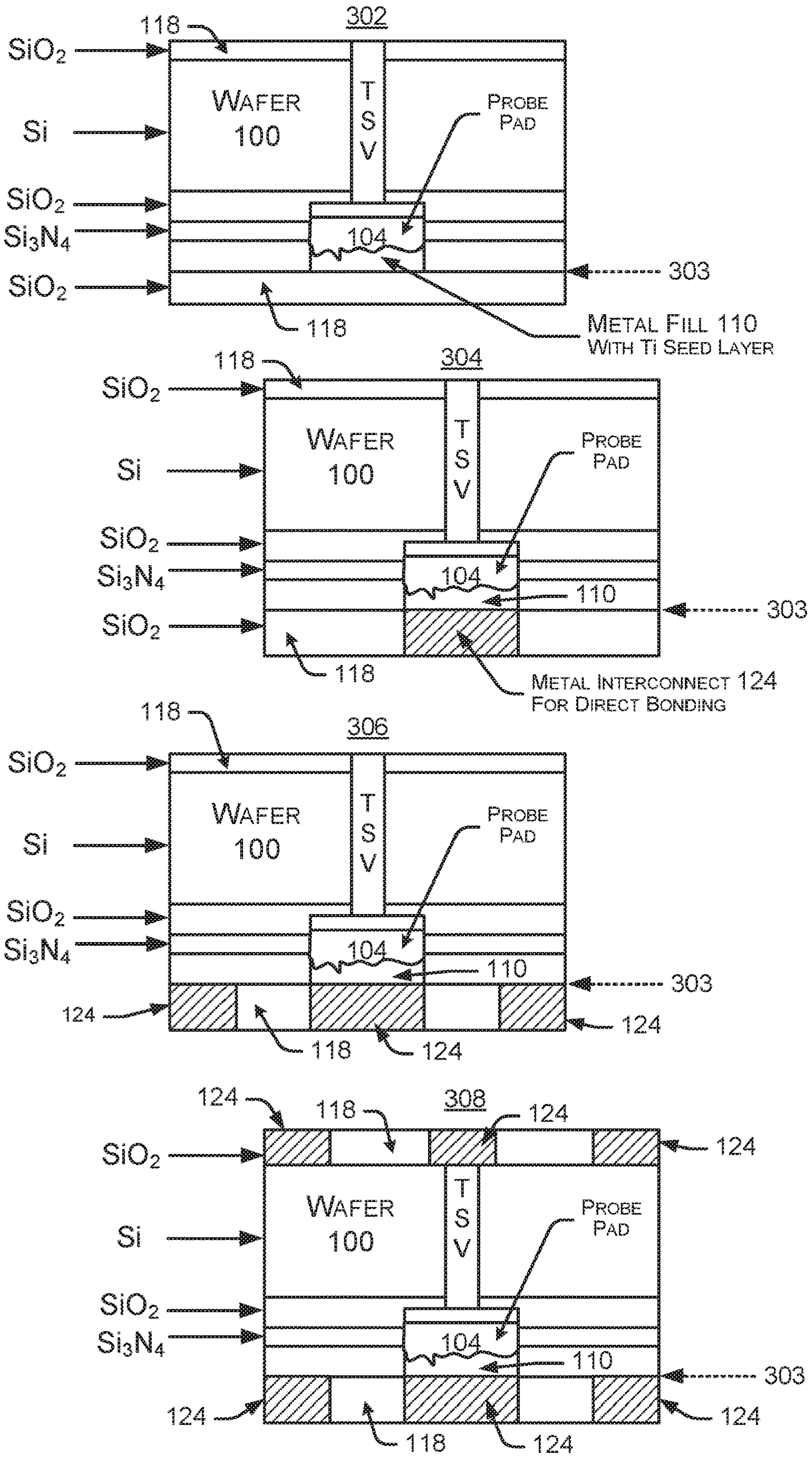
FIG. 3 is a diagram showing various layer structures of a wafer substrate with direct bonding enabled on one or both surfaces of the wafer substrate by the example process shown in FIGS. 1-2.

FIG. 3 shows various example stack structures for substrates, such as wafers (or dies) in this example, made possible in various implementations by applying the example method described with respect to FIGS. 1-2. The example stack structures enable direct bonding or hybrid bonding on one, or both, surfaces of the substrates, such as the wafer (or die) 100 and its built-up layers. The substrate may be part of a high bandwidth memory (HBM) wafer (or die) 100.

Example layer structure 302 for the wafer (or die) 100 provides a metal fill 110 and subsequent planarization 303 of disrupted probe pads 104 and the metal fill 110. A layer of dielectric 118 on the top and bottom of the structure 302 allows dielectric-to-dielectric (oxide-oxide) direct bonding at the bottom surface, and hybrid bonding of both dielectric regions and metal regions on the top surface of the structure 302. The oxide-oxide direct bonding (at the bottom surface) may be accomplished by oxide-to-oxide direct bonding, such as Zibond® brand direct bonding, for example (Xperi Corporation, San Jose, Calif.). The top surface provides a TSV reveal, with a surface possessing both metal regions and dielectric regions, enabled for hybrid bonding such as can be accomplished by DBI® brand hybrid bonding (Xperi Corporation, San Jose, Calif.).

Layer structure 304 has all the features of layer structure 302, above, with the addition of interconnect metal 124 added in a hybrid bonding layer at the bottom of the structure 304. In this example structure 304, the interconnect metal 124 is electrically connected to the same circuit that the probe pad 104 is also connected to, thereby offering the possibility of test probing the circuit before connecting the same circuit to another wafer, die, or substrate.

Layer structure 306 has all the features of the previous layer structure 304, above, with the addition of a fuller fill of interconnect metal 124 on a bottom hybrid bonding layer. Thus, the same hybrid bonding layer that mitigates the protrusions 106 of the disrupted probe pads 104 is used as a full hybrid bonding layer with many interconnects. The interconnect metal 124 may be provided as a regular or non-regular array, pattern, or layout that includes operational pads and/or non-operational "dummy" pads.

Layer structure 308 has all the features of the previous layer structure 306, with the addition of the fuller fill of interconnect metal 124 on both top and bottom surfaces of the structure, which are both hybrid bonding surfaces, enabling full 3D wafer (or die) stacking on both sides of the wafer (or die) 100, accomplished by hybrid bonding on both sides.

The example layer structures 302-308 may have, on a first side of the wafer (or die) 100, a probe pad 104 made of aluminum metal (Al) or copper metal (Cu) at least partially embedded in a layer of silicon nitride ($Si_3N_4$). A titanium (Ti) seed layer can be applied to at least protrusions 106 of the probe pad 104 caused by contact with a test probe. A copper region 110 is deposited on the titanium seed layer above the probe pad 104. Then, a first silicon oxide layer 118 for direct bonding is applied on the surface of the wafer (or die) with an opening over the copper region 110. Copper interconnects 124 for direct bonding are disposed through the silicon oxide layer 118 with at least some of the copper interconnects in contact with the copper region 110.

A tantalum (Ta) layer or other barrier layer material may also be applied between the copper region 110 and the silicon oxide layer 118. The wafer 100 may be a high bandwidth memory (HBM) wafer 100, including the vertical through-silicon vias (TSVs). The structures 302-308 may have other layers, such as another silicon oxide layer between the HBM wafer 100 and the layer of silicon nitride, and the silicon oxide layers 118 (or another dielectric) for direct bonding or hybrid bonding on one or more surfaces of the wafer 100.

Figure 4:
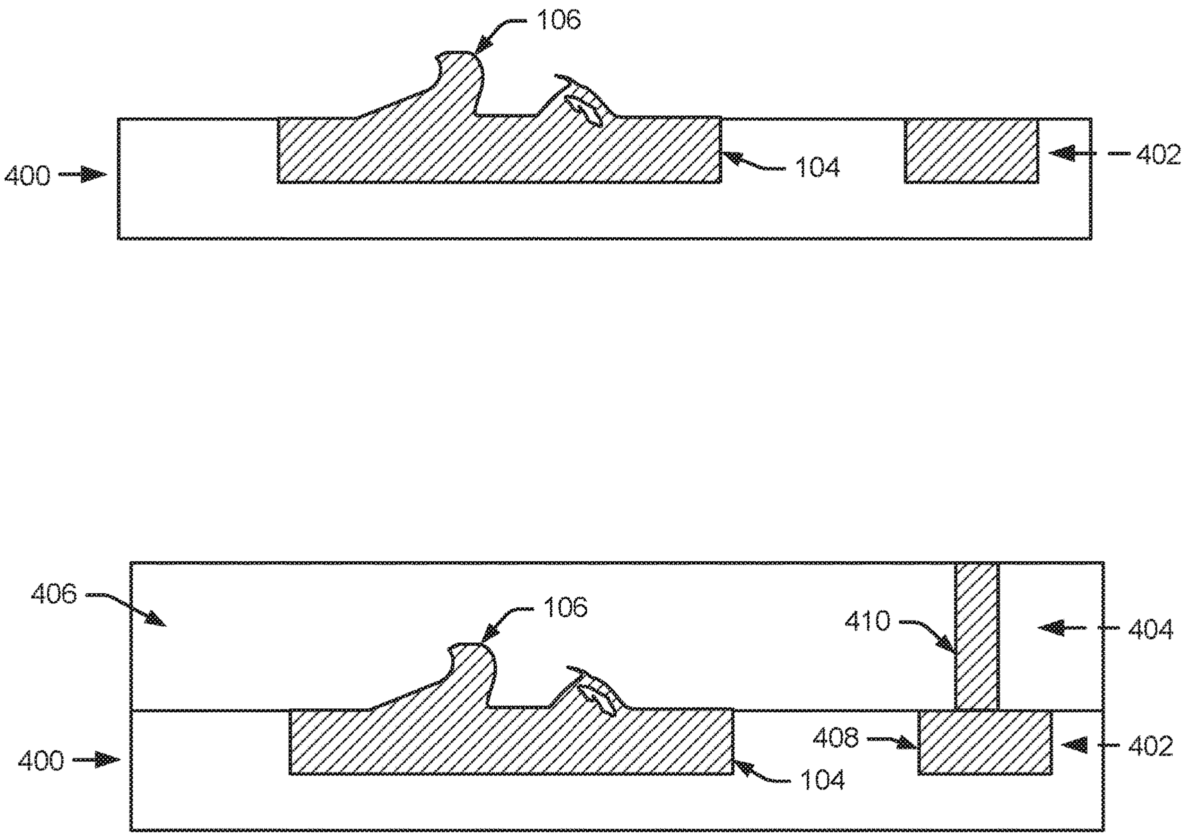
FIG. 4 is a diagram of a second example sequence of fabrication steps and resulting layer structures on a wafer substrate, for mitigating damage to probe pads in preparation for direct bonding of the wafer substrate.

FIG. 4 shows another layer structure and associated example method for preparing a substrate, such as a semiconductor wafer 400 for a direct bonding process after test probing the wafer 400 at the probe pads 104. This example method eliminates a usual metallization layer, such as a conventional M4 layer, and instead fabricates a hybrid bonding layer in place of the eliminated conventional layer. The example method, besides solving the disruption of the probe pads 104, results in no net increase in the number of mask layers for the wafer 400, while adding the capability of hybrid bonding at a top surface.

In greater detail, the example method includes creating the probe pads 104 in a metallization layer 402 that will underlie a top layer 404 for hybrid bonding to another wafer, die, or substrate. This example method builds the dielectric 406 of the top layer 404 directly over the probe pads 104, whereas the example method associated with FIGS. 1-2 filled-in a metal 110 directly over the probe pads 104 instead of the dielectric 406.

After disruption of the probe pads 104 by a test probe resulting in protrusions 106, the method deposits a layer of the dielectric 406, such as silicon oxide, above the probe pads 104. This layer of dielectric 406 is then planarized. Next, the layer of dielectric 406 is patterned to make openings over electrical contacts 408 in the underlying metallization layer 402. The openings are filled with metal 410 to make interconnects 410 to be direct bonded during the direct hybrid bonding process.

A top surface of the interconnects 410 and the layer of dielectric 406 is planarized to a flatness specification suitable for hybrid bonding of the metal regions 410 and the nonmetal regions 406, to another wafer, to a die, or to substrate.

In an implementation, the thickness of the underlying metallization layer 402 with respect to the top layer 404 may be increased, since a conventional layer may be eliminated in this example method.

Figure 5:
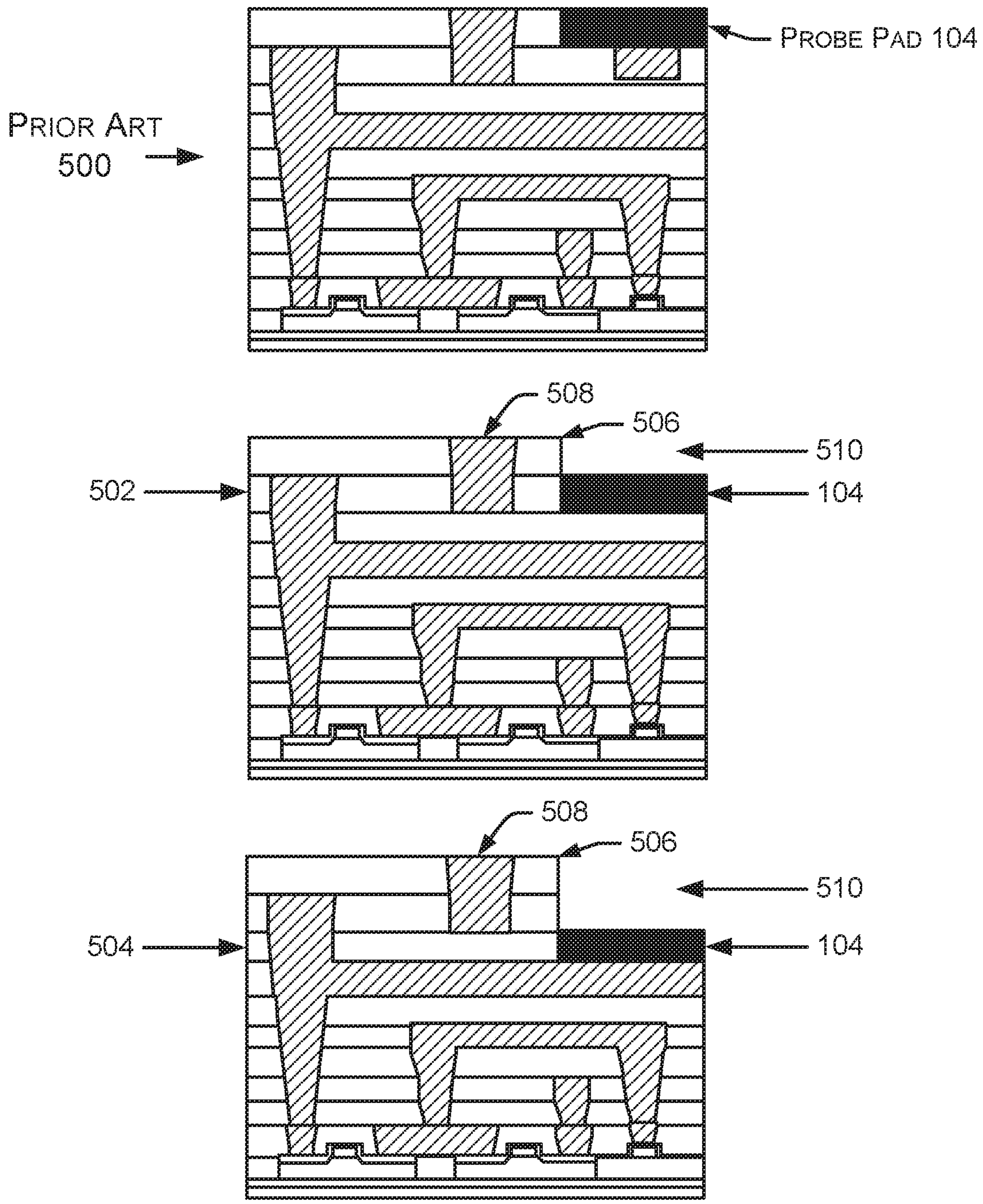
FIG. 5 is a diagram of various embodiments of layer structures for a wafer substrate, in which probe pads are built in recessed cavities to prevent protrusions of disrupted probe pads from interfering with a direct bonding process at a direct bonding surface of the wafer substrate.

FIG. 5 shows another example method for preparing a semiconductor wafer for a direct bonding process, and example layer structures associated with the method. In FIG. 5, a conventional structure 500 shows the probe pads 104 on a topmost metallization layer of the wafer. The example method, by contrast, recesses the probe pads 104 further down from the top layer, within the underlying layers being fabricated on the wafer. The example method then leaves a recess cavity 510 above the probe pads 104, thereby nullifying the effect of any protrusions 106 arising from the probe pads 104, which may rise up with sufficient vertical height to interfere with a layer above the probe pads 104, and may interfere with direct bonding to occur on the top layer, as would happen when the probe pads 104 are on top, as in the conventional structure 500.

The example method creates the probe pads 104 on a second-to-last metallization layer 502 or on a third-to-last metallization layer 504 of the wafer. After subsequent layers are built, the method creates a last layer 506 (topmost layer) including interconnects 508 compatible with a direct bonding process, the last layer 506 forming recess cavities 510 over the probe pads 104.

When the probe pads 104 are created on the third-to-last metallization layer 504, the second-to-last metallization layer 502 also forms part of the recess cavities 510 over the probe pads 104.

In one variation, the example method includes increasing a thickness of the second-to-last metallization layer 502 or the third-to-last metallization layer 504 on which the probe pads 104 reside, with respect to a subsequent layer above.

Figure 6:
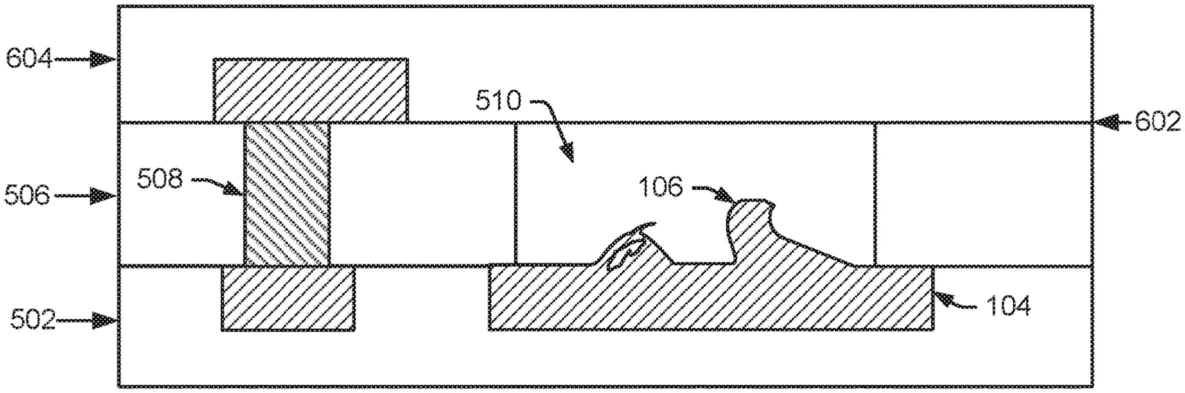
FIG. 6 is a diagram of the wafer substrate of FIG. 5, direct bonded to another wafer substrate, in which disrupted probe pads are isolated in recessed cavities that do not interfere with the direct bonding interface.

In FIG. 6, when the wafer 506, including at least the interconnects 508, is direct bonded at interface 602 to another wafer 604, die, or substrate, the recess cavities 510 are compatible with the direct bonding process, remaining open cavities 510 in one implementation.

Figure 7:
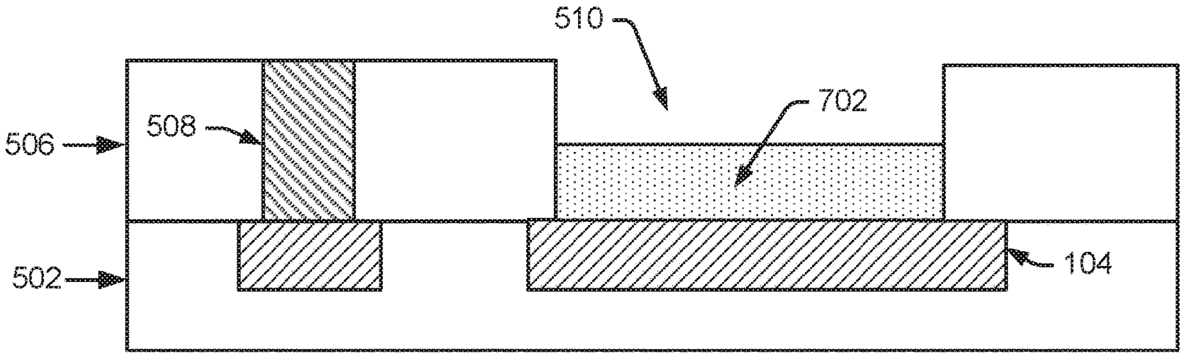
FIG. 7 is a diagram of an example technique of using a liquid metal in recessed cavities built around probe pads to make electrical connections during probe testing while preventing disruption of the solid surface of the probe pads.

FIG. 7 shows an example structure depicting another example process, related to the method described with respect to FIGS. 5-6. In FIG. 7, a liquid metal 702, such as gallium (Ga) may be placed in the recess cavities 510 to make an electrical contact between a test probe and a respective probe pad 104 without disrupting a metal surface of the probe pad 104. This example method creates the same recess cavities 510 as described with respect to FIGS. 5-6, but uses the recess cavities 510 to mitigate the problem of damaged probe pads 104, albeit in a different manner. The method of FIGS. 5-6 allows the protrusions 106 of the probe pads 104 to exist, and just isolates the protrusions 106 in the recess cavity 510, away from the direct bonding interface 602. The method of FIG. 7 prevents damage to the probe pads 104 in the first place, by making test probe connections through the liquid metal 702, ideally without contacting the solid surface of the probe pads 104.

Figure 8:
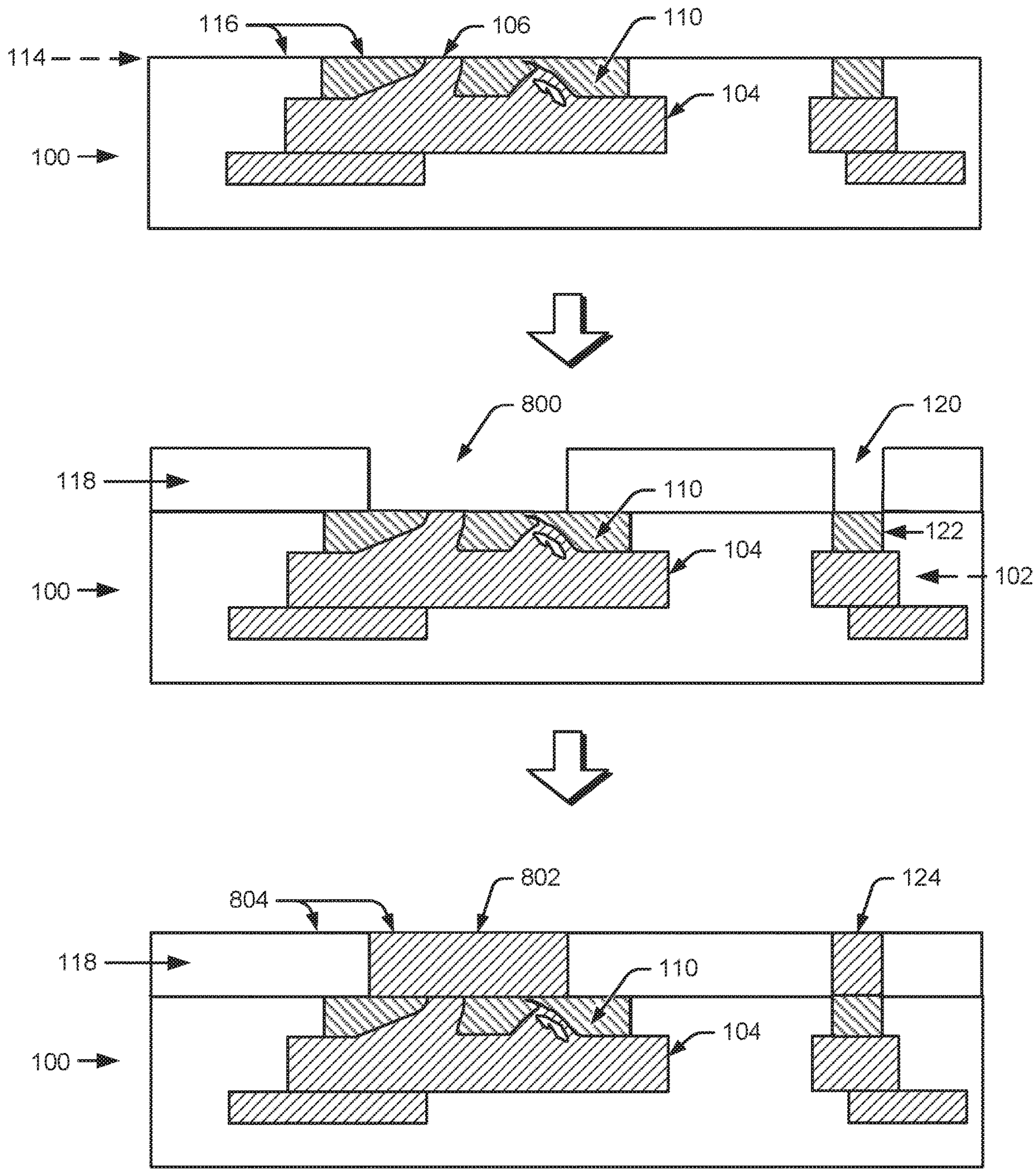
FIG. 8 is a diagram of another example continuation of the sequence of fabrication steps and resulting layer structures of FIG. 1, for mitigating damage to probe pads in preparation for direct bonding of the wafer substrate, in which interconnects or bonding pads on a flat surface to be direct bonded are conductively connected to damaged probe pads via a copper region in direct contact with the damaged probe pads.

FIG. 8 shows another process in continuation of the initial process steps shown in FIG. 1. As in FIG. 1, but referring to FIG. 8, a metal 110 is deposited directly on the probe pads 104 and on top of the protrusions 106 or at least around the protrusions 106 caused by probe damage, and this metal 110 and the tops (if any) of the protrusions 106 undergo a planarization process 114 by chemical mechanical polishing (CMP) or another flattening or polishing procedure to become a flat surface 116 sufficient to meet a general planarization specification. The step of planarizing 114 applied to both the metal 110 over or around the probe pads 104 and the protrusions 106 to create the flat surface 116 may include removing or polishing overfilled metal on the field regions of the wafer 100 to flatness until the metal 110 is removed from those field regions.

A layer of a dielectric material 118 is then applied on the flat surface 116 provided by CMP. The layer of dielectric material 118 is a suitable material for direct bonding or hybrid bonding to another wafer, die, or substrate. In an implementation, the dielectric or oxide material 118 is a layer of "low temperature" oxide, a low temperature tetraethoxysilane (LT-TEOS), or another dielectric material suitable for direct bonding or direct hybrid bonding as is known in the art.

The example process then creates a pattern 120 & 800 in the layer of dielectric 118 using a damascene or other technique to make openings 120 & 800 over electrical contacts 122, over through-silicon-vias (TSVs), or over other interconnects that are in contact with an underlying layer of metallization 102. In contrast to FIG. 2, openings are also made (or only made) over the probe pads 104 and over the metal 110 that has been deposited and subjected to planarization 114, over the probe pads 104.

A metal 124 & 802 suitable for direct bonding is then deposited or plated in the openings 120 & 800 or in the pattern, to form interconnects to be hybrid bonded at the direct bonding interface 804. The deposited metal 124 & 802 may be prepared in various ways for the hybrid bonding process to occur at the topmost surface 804 of the applied layers. In an implementation, a barrier layer of Ti, Ta, TaN, TiN, or TiW (or a combination of these) can be deposited before depositing the metal 124 & 802, such as copper or aluminum or another metal, in the openings 120 & 800 if intermixing of metal and semiconductor is an issue in a particular configuration, the barrier layer gets placed after patterning 120 & 800 the layer of dielectric 118.

The metal 124 & 802 and the layer of dielectric 118 is then planarized with CMP or other technique to a flatness specification suitable for the direct bonding process or hybrid bonding process at the topmost surface 804.

In one example embodiment, the probe pads 104 are at least partially embedded in a layer of silicon nitride ($Si_3N_4$) or other dielectric. The metal 110 to be deposited, plated, or overfilled onto the probe pads 104 may be added up to a vertical height that reaches or fills-in to the top of a passivation layer, such as a silicon nitride or a silicon oxide layer around the probe pads 104.

This example process of FIG. 8 provides a direct bonding surface 804 for hybrid bonding of the oxide layer 118 and the flat metal interconnects 124 & 802, in which some of the interconnects 802 are conductively connected to the damaged probe pads 104 below via the deposited metal 110. In an implementation, the interconnects 802 are only over the probe pads 104, or only over the electrical contacts 122 of a metallization layer 102, as in FIG. 2.

The hybrid bonding could also occur at flat surface 116 after planarization 114 and before placement of the dielectric layer 118 and interconnects 124 & 802. In an embodiment, the bonding surface 108 may be plasma activated in preparation for bonding.

If the wafer 100 is a substrate made of a dielectric or oxide material suitable for hybrid bonding, and not a semiconductor material, then the hybrid bonding may occur at surface 116 and one or more additional layers of metallization 118 & 124 & 802 may not be not needed.

The implementations shown in FIG. 8 are compatible with the interconnect structures and layer configurations illustrated in FIG. 3.

Example Methods

Figure 9:
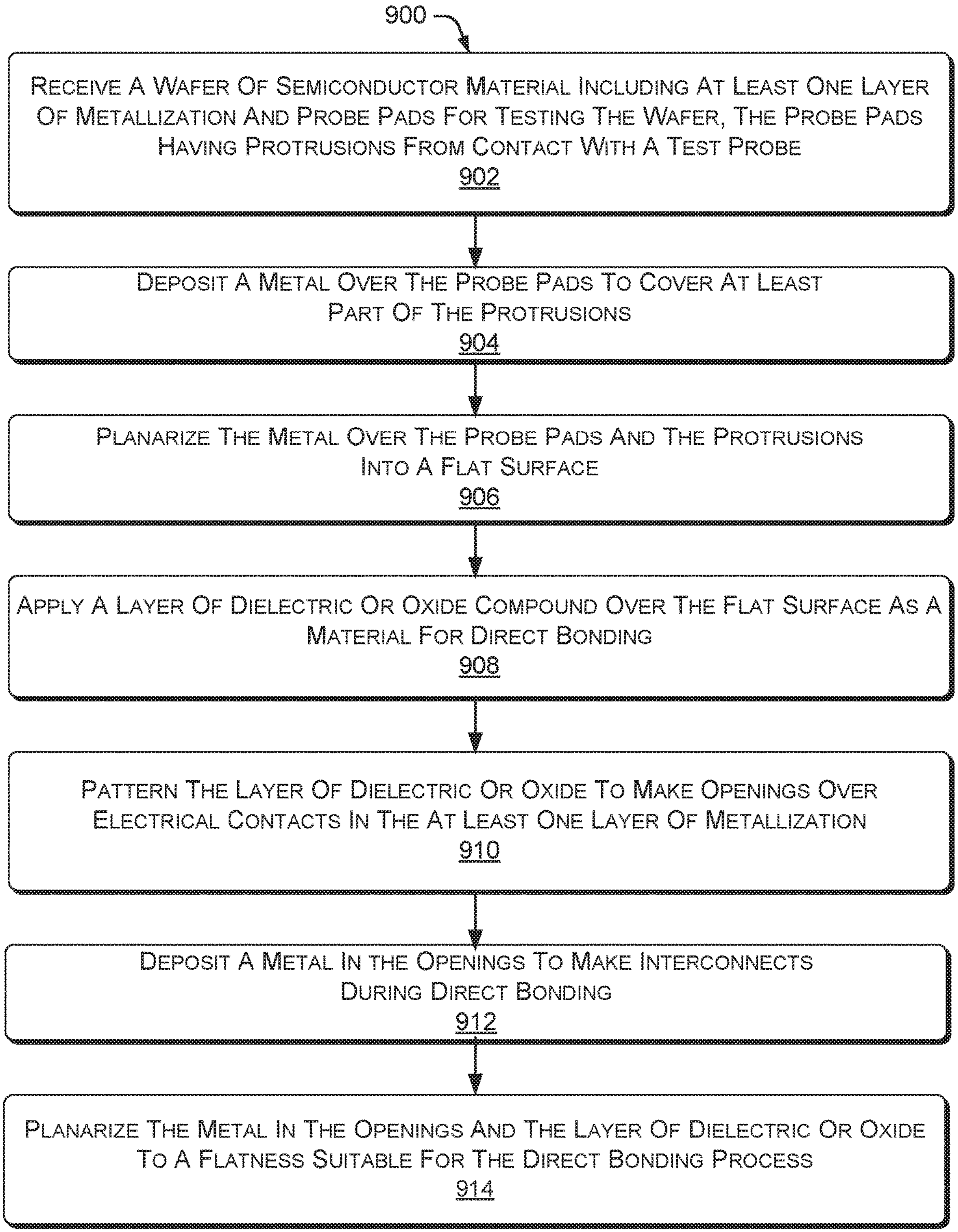
FIG. 9 is a flow diagram of an example method of preparing a wafer with probe pads for direct bonding after disruption of the probe pads, by filling-in and planarizing over the disrupted probe pads.

FIG. 9 shows an example method 900 of preparing a wafer with probe pads for direct bonding after disruption of the probe pads, by filling-in and planarizing over the disrupted probe pads. Operations of the example method 900 are shown in individual blocks.

At block 902, a wafer of semiconductor material is received, including at least one layer of metallization, and probe pads for testing the wafer. The probe pads may have protrusions and surface disturbances from contact with a test probe.

At block 904, a metal is deposited over the probe pads to cover at least part of the protrusions.

At block 906, the metal over the probe pads and protrusions is planarized into a flat surface.

At block 908, a layer of a dielectric is applied over the flat surface as a material for direct bonding.

At block 910, the layer of dielectric is patterned to make openings over electrical contacts in an underlying layer of metallization. The openings may be made by etching, a damascene process, or even by conventional via creation.

At block 912, a metal is deposited in the openings for making interconnects during direct bonding between the wafer and another wafer, or die, or substrate being direct bonded to.

At block 914, the metal in the openings, as well as the layer of dielectric is planarized to a flatness sufficient for direct bonding or direct hybrid bonding.

Figure 10:
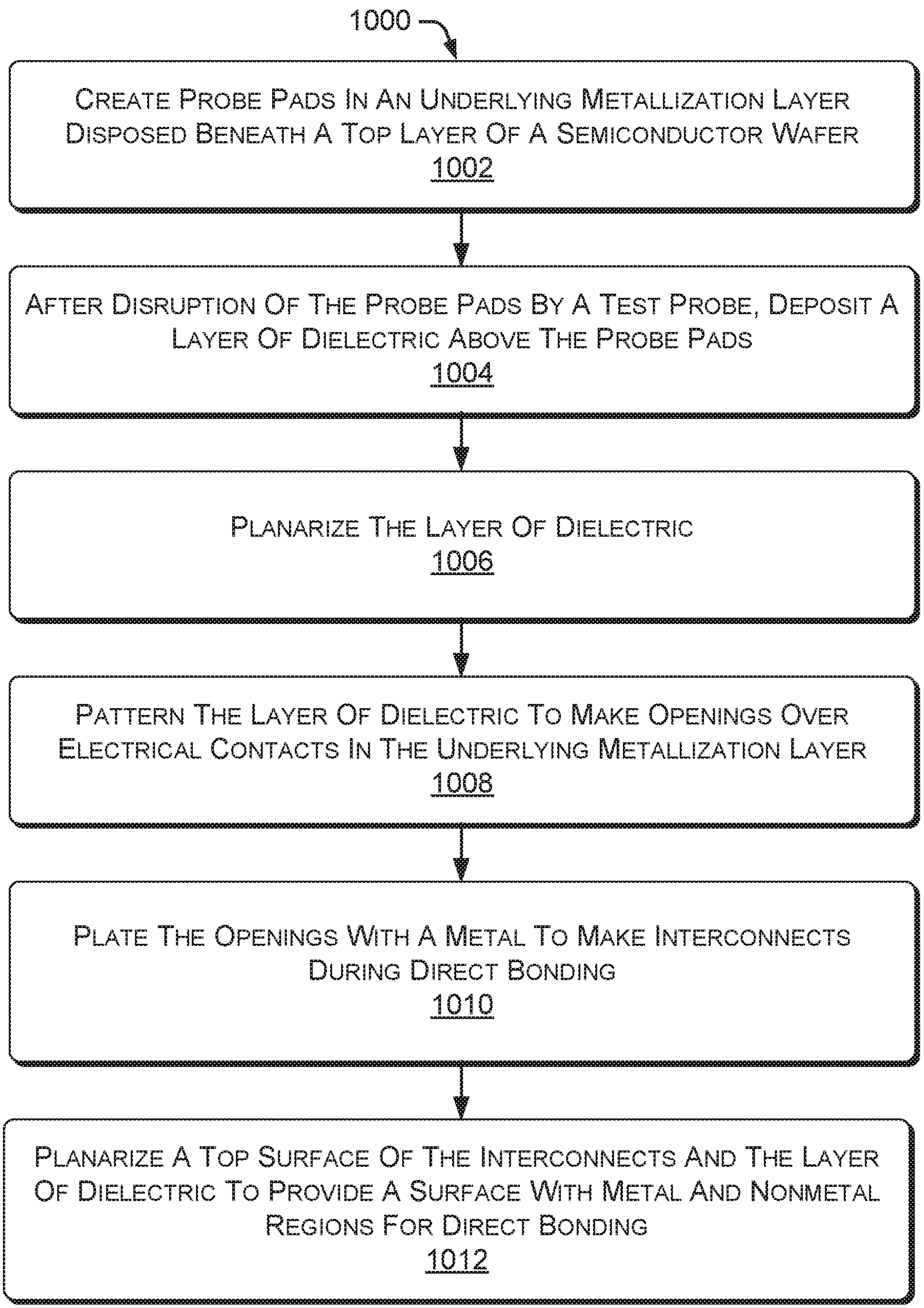
FIG. 10 is a flow diagram of an example method of preparing a wafer with probe pads for direct bonding after disruption of the probe pads, by eliminating a top metallization layer of the wafer and substituting a direct hybrid bonding layer as top layer of the wafer.

FIG. 10 shows an example method of preparing a wafer with probe pads for direct bonding after disruption of the probe pads, by eliminating a top metallization layer of the wafer and substituting a hybrid bonding layer as top layer of the wafer. Operations of the example method 1000 are shown in individual blocks.

At block 1002, probe pads are created in an underlying metallization layer disposed beneath a top layer of a semiconductor wafer.

At block 1004, after disruption of the probe pads by a test probe, a layer of dielectric is deposited above the probe pads.

At block 1006, the applied layer of dielectric is planarized to flatness.

At block 1008, the layer of dielectric is patterned to make openings over electrical contacts in the underlying metallization layer.

At block 1010, the openings are plated or filled with a metal to make interconnects during direct bonding.

At block 1012, the top surface of the interconnects and the layer of dielectric are planarized to provide a flat surface with metal regions and nonmetal regions for direct bonding, such as hybrid bonding.

Figure 11:
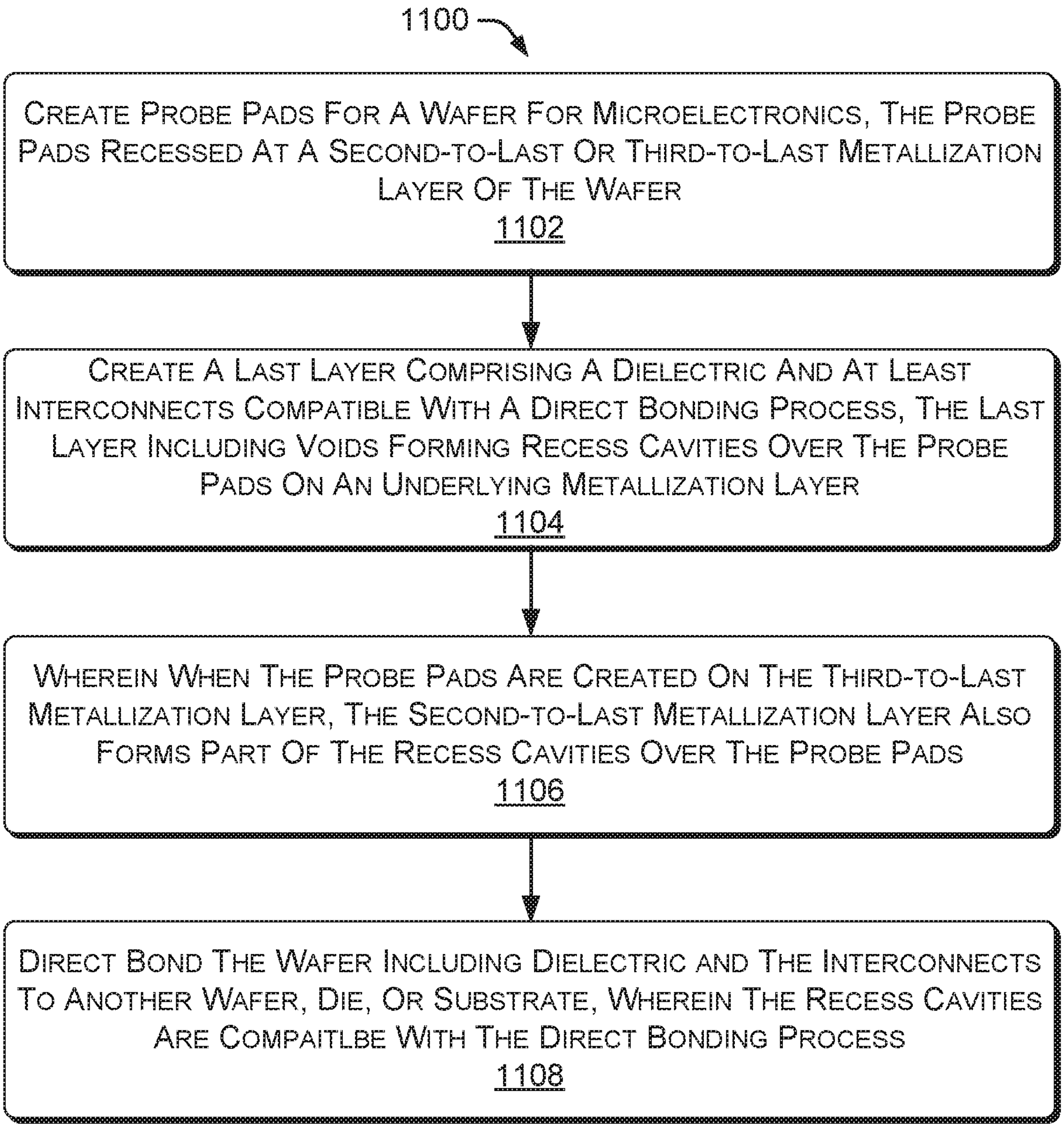
FIG. 11 is a flow diagram of an example method of preparing a wafer substrate with probe pads for direct bonding after disruption of the probe pads, by recessing the probe pads in recess cavities that isolate the probe pads from the direct bonding interface.

FIG. 11 shows an example method of preparing a substrate, such as a wafer with probe pads for direct bonding after disruption of the probe pads, by recessing the probe pads in recess cavities that isolate the probe pads from the direct bonding interface. Operations of the example method 1100 are shown in individual blocks.

At block 1102, probe pads are created for a wafer substrate being fabricated for microelectronics by recessing the probe pads to a second-to-last or third-to-last metallization layer of the wafer substrate.

At block 1104, a last layer is created for the wafer substrate consisting of a dielectric and at least metal interconnects compatible with a direct bonding process, wherein the last layer has voids for forming recess cavities over the probe pads disposed on an underlying metallization layer.

At block 1106, when the probe pads are created on the third-to-last metallization layer, then the second-to-last metallization layer also forms part of the recess cavities over the probe pads.

At block 1108, the wafer is direct bonded to another wafer, a die, or a substrate, including direct bonding of the dielectric, and direct bonding of the interconnects. The recess cavities are compatible with the direct bonding process, and in one implementation remain open cavities after the direct bonding process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term “coupled” is used herein to express a direct connection as well as a connection through one or more intervening circuits or structures. The terms “example,” “embodiment,” and “implementation” are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A method of preparing a substrate for a direct bonding process, comprising:

receiving a substrate including at least one layer of metallization and probe pads for testing the substrate, the probe pads having protrusions resulting from contact with a test probe, wherein the protrusions extend from the probe pads and above a top level of a surrounding layer that comprises one or more of a dielectric, an oxide, or a nitride, and wherein the protrusions are not covered by any of the surrounding layer that comprises one or more of the dielectric, the oxide, or the nitride;

depositing or overfilling a metal over the probe pads and over at least part of the protrusions, the metal in direct contact with the probe pads; and planarizing the metal over the probe pads and the protrusions into a flat surface capable of a direct bonding process or a hybrid bonding process.

2. The method of claim 1, further comprising applying a layer of a dielectric over the flat surface as a material for a direct bonding process or a hybrid bonding process on the layer of dielectric;

patterning the layer of dielectric to make openings over electrical contacts in the at least one layer of metallization;

depositing a metal into at least the openings to make interconnects for the direct bonding process at the layer of dielectric; and planarizing the metal and the layer of dielectric to a flatness capable of the direct bonding process or the hybrid bonding process on the layer of dielectric.

3. The method of claim 2, further comprising patterning the layer of dielectric to make openings over the probe pads; and depositing the metal into at least the openings to make probe pad interconnects for the direct bonding process at the layer of dielectric, the probe pad interconnects conductively connected to the probe pads.

4. The method of claim 1, wherein the probe pads are at least partially embedded in a layer of silicon nitride ($Si_3N_4$) or other dielectric.

5. The method of claim 1, wherein depositing or overfilling the metal over the probe pads comprises plating the metal to a vertical height of the surrounding layer; and wherein the planarizing the metal over the probe pads and the protrusions into a flat surface comprises polishing overfilled metal to flatness until the metal is removed from field regions of the substrate.

6. The method of claim 1, wherein the probe pads comprise aluminum metal (Al) and the metal deposited over the probe pads comprises copper metal (Cu).

7. The method of claim 1, further comprising depositing an adhesion coating, a seed coating, or a barrier coating of titanium (Ti) or another metal on at least the protrusions and the probe pads before the depositing or overfilling the metal over the probe pads.

8. The method of claim 2, wherein the applying the layer of dielectric over the flat surface as a material for direct bonding comprises applying a layer of low temperature oxide by plasma enhanced chemical vapor deposition (PECVD), applying a low temperature tetraethoxysilane (TEOS) oxide, or applying another dielectric material for direct bonding or hybrid bonding.

9. The method of claim 2, further comprising depositing a barrier layer of Ti, Ta, TaN, TiN, TiW or comprising a combination of materials before depositing the metal in at least the openings after patterning the layer of dielectric.

10. A layer structure for making one or more direct bonding surfaces in relation to probe pads on a substrate for microelectronics, the layer structure comprising:

on a first side of the substrate:

a probe pad comprising aluminum metal (Al) or copper metal (Cu) at least partially embedded in a layer of silicon nitride ($Si_3N_4$) or other dielectric material;

a barrier layer or an adhesion layer, the barrier layer or the adhesion layer comprising one of Ti, Ta, TaN, TiN, or TiW, or comprising a combination of two or more selected from the group consisting of Ti, Ta, TaN, TiN, and TiW applied to at least protrusions of the probe pad caused by contact with a test probe, wherein the protrusions extend from the probe pads and above a top level of a surrounding layer comprising one or more of a dielectric, an oxide, or a nitride and wherein the protrusions are not covered by any of the surrounding layer;

a copper region deposited directly on the layer of the Ti, Ta, TaN, TiN, or TiW or the combination above the probe pad, the copper region conductively connected to the probe pad; and a first silicon oxide layer for direct bonding, the first silicon oxide layer applied on the copper region.

11. The layer structure of claim 10, further comprising a copper interconnect for direct bonding disposed through the first silicon oxide layer by etching the first silicon oxide layer and depositing the copper interconnect or by a damascene process, wherein the copper interconnect is conductively connected to the probe pad or to an electrical contact in a layer of metallization of the substrate.

12. The layer structure of claim 10, further comprising a tantalum (Ta) layer between the copper region and the first silicon oxide layer.

13. The layer structure of claim 10, wherein the substrate comprises a high bandwidth memory (HBM) wafer including vertical through-silicon vias (TSVs);

the layer structure further comprising a second silicon oxide layer between the HBM wafer and the layer of silicon nitride or other dielectric material; and a third layer of silicon oxide, for direct bonding, on a second side of the HBM wafer opposing the first side of the HBM wafer.

14. The layer structure of claim 13, further comprising copper interconnects for direct bonding disposed through the third layer of silicon oxide.

15. A method of preparing a semiconductor substrate for a direct bonding process, comprising:

creating probe pads in a metallization layer of the semiconductor substrate;

contacting the probe pads with a test probe such that the probe pads have protrusions resulting from contact with the test probe, wherein the protrusions extend from the probe pads and above a top level of the metallization layer, and wherein the protrusions are not covered by any portions of any surrounding layer;

after contacting the probe pads with the test probe, depositing a layer of dielectric over and on the probe pads;

planarizing the layer of dielectric;

patterning the layer of dielectric to make openings over electrical contacts in the metallization layer;

plating the openings with a metal to become interconnects during the direct bonding process, wherein the metal directly contacts the electrical contacts; and planarizing a top surface of the metal and the layer of dielectric to provide a surface possessing metal and nonmetal regions for a hybrid bonding process.

16. The method of claim 15, further comprising increasing a thickness of the metallization layer with respect to a top layer of the substrate to assist with elimination of a conventional layer of the substrate being replaced by the top layer for direct bonding.

17. A method for preparing a semiconductor wafer for a direct bonding process, comprising:

creating probe pads on a substrate for microelectronics, the probe pads recessed at a second-to-last or a third-to-last metallization layer of the substrate;

creating a last layer comprising at least interconnects compatible with a hybrid bonding process, the last layer forming recess cavities over the probe pads;

wherein, when the probe pads are created on the third-to-last metallization layer, the second-to-last metallization layer also forms part of the recess cavities over the probe pads; and hybrid bonding the substrate including at least the interconnects to a wafer, a die, or another substrate, wherein the recess cavities (i) remain hollow cavities after the hybrid bonding and (ii) are compatible with the direct bonding process.

18. The method of claim 17, further comprising increasing a thickness of the second-to-last or the third-to-last metallization layer with respect to the last layer.

19. The method of claim 17, further comprising depositing a liquid metal in the recess cavities to make an electrical contact between a test probe and a respective probe pad without disrupting a metal surface of the probe pad.

20. A layer structure for preparing a semiconductor substrate for a direct bonding process, comprising:

probe pads of the wafer on a second-to-last or a third-to-last metallization layer of the substrate; and a last layer comprising a dielectric and at least interconnects compatible with a direct bonding process, the last layer including voids to form recess cavities over the probe pads on an underlying metallization layer, wherein when the probe pads are on the third-to-last metallization layer, the second-to-last metallization layer also forms part of the recess cavities over the probe pads, wherein the dielectric and at least the interconnects are direct bonded to another wafer or die, and wherein the recess cavities remain hollow cavities after the interconnects are direct bonded.

21. The layer structure of claim 20, further comprising at least a trace of a liquid metal in a recess cavity, the liquid metal for making an electrical contact between a test probe and a respective probe pad without disrupting a metal surface of the probe pad.

22. The layer structure of claim 20, wherein the second-to-last or the third-to-last metallization layer comprising the probe pads has a greater thickness than the last layer.

* * * * *

UNITED STATES PATENT AND TRADEMARK OFFICE

CERTIFICATE OF CORRECTION

PATENT NO. : 11,355,404 B2
APPLICATION NO. : 16/845913
DATED : June 7, 2022
INVENTOR(S) : Gao et al.

It is certified that error appears in the above-identified patent and that said Letters Patent is hereby corrected as shown below:

In the Claims

In Claim 10, Column 10, Line 37, please replace “nitride” with -- nitride, --.

Signed and Sealed this
Nineteenth Day of December, 2023

Katherine Kelly Vidal

Katherine Kelly Vidal
*Director of the United States Patent and Trademark Office*